(12) United States Patent
Ohashi et al.

(10) Patent No.: US 9,331,047 B2
(45) Date of Patent: May 3, 2016

(54) MOUNTING METHOD AND MOUNTING STRUCTURE FOR SEMICONDUCTOR PACKAGE COMPONENT

(71) Applicants: Naomichi Ohashi, Hyogo (JP); Atsushi Yamaguchi, Osaka (JP); Arata Kishi, Nara (JP); Masato Udaka, Hyogo (JP); Seiji Tokii, Osaka (JP)

(72) Inventors: Naomichi Ohashi, Hyogo (JP); Atsushi Yamaguchi, Osaka (JP); Arata Kishi, Nara (JP); Masato Udaka, Hyogo (JP); Seiji Tokii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/092,407

(22) Filed: Nov. 27, 2013

(65) Prior Publication Data

US 2014/0120663 A1    May 1, 2014

Related U.S. Application Data

(62) Division of application No. 13/003,996, filed as application No. PCT/JP2010/002800 on Apr. 19, 2010, now abandoned.

(30) Foreign Application Priority Data

Apr. 24, 2009  (JP) .................................. 2009-105757
Apr. 24, 2009  (JP) .................................. 2009-105758

(51) Int. Cl.
| | | |
|---|---|---|
| H01L 21/00 | (2006.01) | |
| H01L 23/00 | (2006.01) | |
| H05K 3/30 | (2006.01) | |
| H05K 3/34 | (2006.01) | |

(52) U.S. Cl.
CPC ................ *H01L 24/83* (2013.01); *H05K 3/305* (2013.01); *H01L 2924/15311* (2013.01); *H05K 3/3494* (2013.01); *H05K 2201/10734* (2013.01); *H05K 2203/0545* (2013.01); *H05K 2203/1476* (2013.01)

(58) Field of Classification Search
None
See application file for complete search history.

(56) References Cited

U.S. PATENT DOCUMENTS

| | | |
|---|---|---|
| 5,814,401 A | 9/1998 | Gamota et al. |
| 5,891,753 A | 4/1999 | Akram |
| 5,898,224 A | 4/1999 | Akram |
| 5,936,304 A | 8/1999 | Lii et al. |
| 6,046,910 A | 4/2000 | Ghaem et al. |
| 6,049,124 A | 4/2000 | Raiser et al. |
| 6,093,972 A | 7/2000 | Carney et al. |
| 6,274,389 B1 | 8/2001 | Iida et al. |
| 6,340,846 B1 | 1/2002 | LoBianco et al. |

(Continued)

FOREIGN PATENT DOCUMENTS

| | | |
|---|---|---|
| JP | 07-131145 | 5/1995 |
| JP | 11-163049 | 6/1999 |

(Continued)

*Primary Examiner* — Hoang-Quan Ho
(74) *Attorney, Agent, or Firm* — Hamre, Schumann, Mueller & Larson, P.C.

(57) ABSTRACT

A semiconductor package component (3) is mounted on a substrate (1) in such a manner that an electrode (2) of the substrate (1) and an electrode of the semiconductor package component (3) are brought into contact with each other through a joining material (4). A reinforcing adhesive (5c) is applied between the substrate (1) and the outer surface of the semiconductor package component (3). Then, reflow is performed to melt the joining metal (4) with the reinforcing adhesive (5c) uncured. After the reinforcing adhesive (5c) is cured, the joining metal (4) is solidified.

3 Claims, 14 Drawing Sheets

(56) References Cited

U.S. PATENT DOCUMENTS

| | | |
|---|---|---|
| 6,404,062 B1 | 6/2002 | Taniguchi et al. |
| 6,441,485 B1 | 8/2002 | Glenn |
| 6,486,554 B2 | 11/2002 | Johnson |
| 6,617,684 B2 | 9/2003 | Akram et al. |
| 6,661,104 B2 | 12/2003 | Jiang et al. |
| 6,667,557 B2 | 12/2003 | Alcoe et al. |
| 6,700,209 B1 | 3/2004 | Raiser et al. |
| 2002/0142514 A1* | 10/2002 | Scheifers et al. ............. 438/107 |
| 2004/0238925 A1 | 12/2004 | Morganelli et al. |
| 2004/0262368 A1 | 12/2004 | Haw et al. |
| 2005/0077080 A1 | 4/2005 | Dairo et al. |
| 2008/0036097 A1* | 2/2008 | Ito et al. ........................ 257/778 |
| 2008/0251942 A1* | 10/2008 | Ohuchi et al. ................ 257/778 |
| 2008/0303145 A1 | 12/2008 | Takizawa et al. |
| 2008/0308930 A1 | 12/2008 | Yoshida |
| 2009/0014873 A1 | 1/2009 | Yokota et al. |
| 2009/0134529 A1* | 5/2009 | Ishii et al. ..................... 257/779 |
| 2010/0000773 A1 | 1/2010 | Yoshinaga et al. |
| 2010/0309628 A1* | 12/2010 | Takizawa et al. ............. 361/688 |
| 2011/0037181 A1* | 2/2011 | Gaynes et al. ................ 257/788 |

FOREIGN PATENT DOCUMENTS

| | | | |
|---|---|---|---|
| JP | 11-204568 | 7/1999 | |
| JP | 2000-332167 | 11/2000 | |
| JP | 2002-198384 | 7/2002 | |
| JP | 2003-197681 | 7/2003 | |
| JP | 2003-218508 | 7/2003 | |
| JP | 2003197681 A * | 7/2003 | ............ H01L 21/60 |
| JP | 2005-032795 | 2/2005 | |
| JP | 2005-032796 | 2/2005 | |
| JP | 2008-053347 | 3/2008 | |
| JP | 2008-078431 | 4/2008 | |
| JP | 2008-166377 | 7/2008 | |
| JP | 2008-300538 | 12/2008 | |
| JP | 2009-021465 | 1/2009 | |
| WO | WO 2008/035819 | 3/2008 | |

\* cited by examiner

FIG. 9
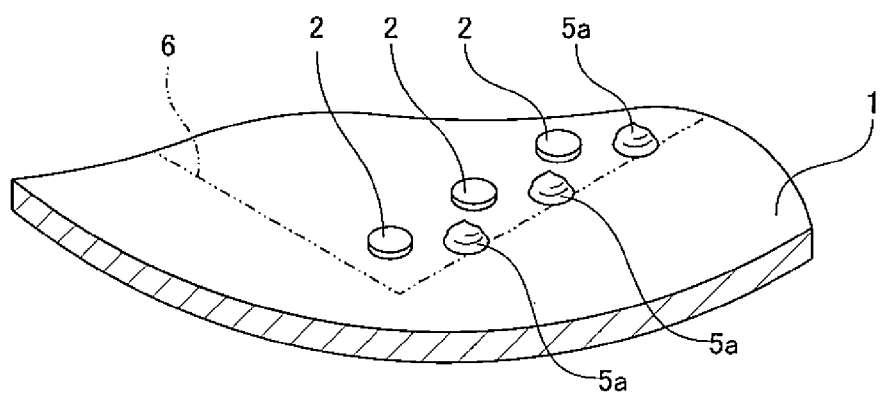
(a)
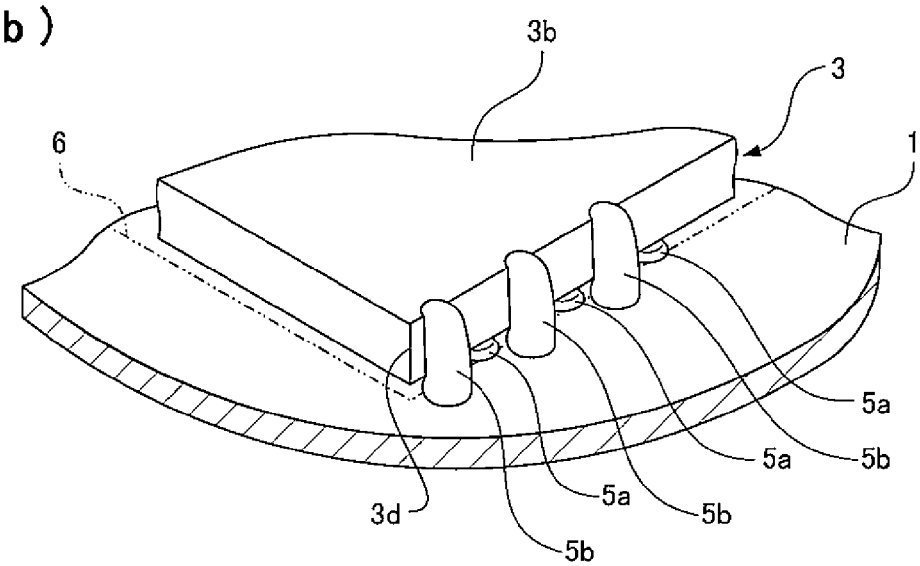
(b)

FIG. 18
PRIOR ART
(a)
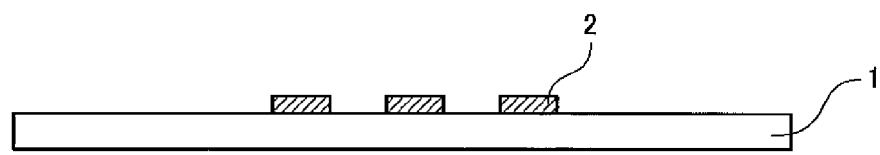
(b)
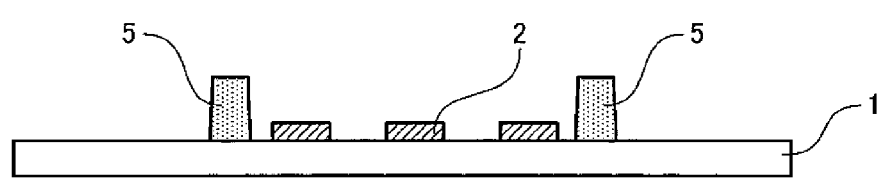
(c)
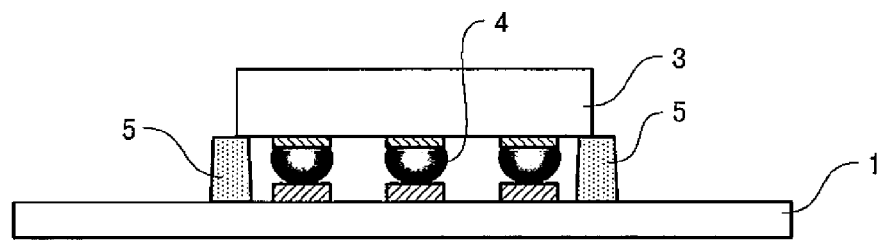
(d)
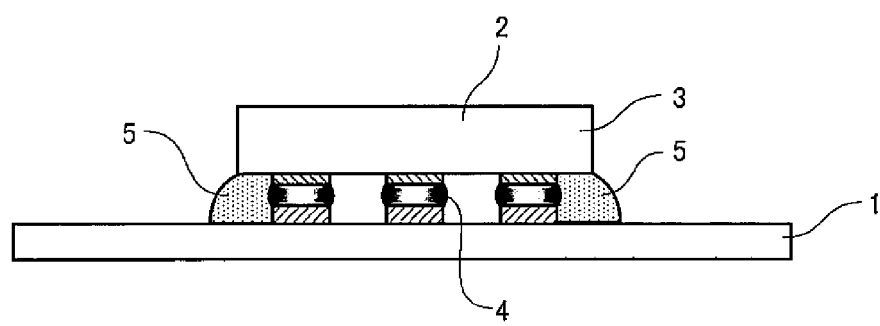

MOUNTING METHOD AND MOUNTING STRUCTURE FOR SEMICONDUCTOR PACKAGE COMPONENT

TECHNICAL FIELD

The present invention relates to a semiconductor package component mounting method for surface-mounting a semiconductor package component on a substrate.

BACKGROUND ART

A semiconductor package component such as a BGA (Ball Grid Array) component having electrodes formed on the underside is mounted in one of the process illustrated in FIGS. 17(a) to 17(e) and the process illustrated in FIGS. 18(a) to 18(d).

In FIGS. 17(a) and 17(b), a semiconductor package component 3 is mounted on a substrate 1 in such a manner that bump electrodes 4 of the semiconductor package component 3 come into contact with electrodes 2 on the substrate 1.

In FIG. 17(c), reflow is performed. In the reflow, the solder of the bump electrodes 4 melts and the semiconductor package component 3 moves to a proper position by the self-alignment effect. Then the substrate and component are cooled to the melting temperature of the solder or lower to solidify the solder, so that electrical connection between the semiconductor package component 3 and the substrate 1 is completed.

In FIG. 17(d), a thermoset resin 5 is injected between the semiconductor package component 3 and the substrate 1 with a syringe or the like.

In FIG. 17(e), the substrate 1 is heated to a temperature not lower than the curing temperature of the thermoset resin 5 to cure the thermoset resin 5, thereby mechanically fixing the semiconductor package component 3 onto the substrate 1.

The method illustrated in FIGS. 17(a) to 17(e) involves two heating steps, the reflow in FIG. 17(c) and the heating in FIG. 17(e). In contrast, the process illustrated in FIGS. 18(a) to 18(d) involves only one heating step.

In FIGS. 18(a) and 18(b), the thermoset resin 5 is applied to a position 6 on the substrate 1 where the semiconductor package component 3 is to be mounted. FIG. 19 illustrates how the thermoset resin 5 is applied.

In FIG. 18(c), the semiconductor package component 3 is mounted on the substrate 1 in such a manner that the bump electrodes 4 of the semiconductor package component 3 come into contact with the electrode 2 on the substrate 1. At this point, the uncured thermoset resin 5 is in contact with the substrate 1 and the underside of the semiconductor package component 3.

In FIG. 18(d), reflow is performed. In the reflow, the solder of the bump electrodes 4 melts. Since the thermoset resin 5 is uncured at this point in time, the semiconductor package component 3 is moved to the proper position by the self-alignment effect of the melted solder between the electrodes on the substrate 1 and the electrodes of the semiconductor package component 3. After the thermoset resin 5 is cured by heating, the temperature decreases to a temperature not higher than the melting temperature of the solder to solidify the solder, so that the electrical connection and mechanical bonding of the semiconductor package component 3 to the substrate 1 are completed. FIG. 20 illustrates the completion of the mounting.

CITATION LIST

Patent Literature

Patent Literature: Japanese Patent Application Laid-Open Publication No. 11-204568

SUMMARY OF INVENTION

Technical Problem

The mounting process illustrated in FIGS. 18 to 20 involves only one heating step. However, the quantity and position of the thermoset resin 5 to be applied are difficult to adjust, thereby causing variations in mounting quality.

Specifically, during the process in which the solder melts and solidifies, the uncured thermoset resin 5 is in the vicinity of or in contact with the solder. Therefore, when the application quantity of the thermoset resin 5 is reduced in order to prevent some of the uncured thermoset resin 5 from melting and being mixed with the solidifying solder to degrade the soldering quality, the strength of the mechanical bonding between the semiconductor package component 3 and the substrate 1 decreases.

An object of the present invention is to provide a semiconductor package component mounting method which can reduce the number of heating steps, stably maintain the quality of electrical joining between a semiconductor package component and a substrate, and ensure a sufficient strength of mechanical bonding between the semiconductor package component and the substrate.

Solution to Problem

A semiconductor package component mounting method according to the present invention includes: mounting a semiconductor package component on a substrate in such a manner that an electrode of the substrate and an electrode of the semiconductor package component are brought into contact with each other through a solidified joining metal; applying a reinforcing adhesive between the periphery of an area on the substrate where the semiconductor package component is mounted and the outer surface of the semiconductor package component in such a manner that the reinforcing adhesive does not contact the joining metal; and performing reflow to melt the joining metal while the reinforcing adhesive is uncured, curing the reinforcing adhesive, and solidifying the joining metal.

A semiconductor package component mounting structure according to the present invention is a structure in which a semiconductor package component is mounted onto a substrate by joining an electrode of the substrate to an electrode of the semiconductor package component with a joining metal. The mounting structure includes: a cured reinforcing adhesive which is not in contact with the joining metal, the reinforcing adhesive extending from a surface of the semiconductor package component opposite a surface facing the substrate to the substrate, wherein the cured reinforcing adhesive extends over a distance L1 onto the opposite surface of the semiconductor package component from an end face of the semiconductor package component and extends over a distance L2 onto the surface of the semiconductor package component facing the substrate from the end face of the semiconductor package component, the end face connecting the surface of the semiconductor package component facing the substrate and the opposite surface; and the distance L1 over which the reinforcing adhesive extends onto the opposite surface of the semiconductor package component from the end face connecting the surface of the semiconductor package component facing the substrate and the opposite surface is equal to or greater than the distance L2 over which the reinforcing adhesive extends onto the surface of the semiconductor package component facing the substrate from the end face of the semiconductor package component.

A semiconductor package component mounting method according to the present invention includes: applying a first reinforcing adhesive to a position on a substrate where a semiconductor package component is to be mounted; mounting the semiconductor package component on the substrate in such a manner that an electrode of the substrate and an electrode of the semiconductor package component are brought into contact with each other through a solidified joining metal; applying a second reinforcing adhesive between the periphery of an area on the substrate where the semiconductor package component is mounted and the outer surface of the semiconductor package component; and performing reflow to melt the joining metal and curing the first and second reinforcing adhesives while the joining metal solidifies.

A semiconductor package component mounting structure according to the present invention is a structure in which a semiconductor package component is mounted on a substrate by joining an electrode of the substrate to an electrode of the semiconductor package component with a joining metal. The mounting structure includes: a cured first reinforcing adhesive disposed between the substrate and a surface of the semiconductor package component facing the substrate; and a cured second reinforcing adhesive disposed from an end face connecting the surface of the semiconductor package component facing the substrate and the opposite surface of the semiconductor package component to the substrate.

A semiconductor package component mounting structure according to the present invention is a structure in which a semiconductor package component is mounted on a substrate by joining an electrode of the substrate to an electrode of the semiconductor package component with a joining metal. The mounting structure includes: a cured first reinforcing adhesive disposed between the substrate and a surface of the semiconductor package component facing the substrate; and a cured second reinforcing adhesive disposed from the surface of the semiconductor package component opposite the surface facing the substrate to the substrate.

Advantageous Effects of Invention

With this configuration, since the reinforcing adhesive is applied after the semiconductor package component is mounted on the substrate, and in the heating step, the reinforcing adhesive is sufficiently cured after the joining metal has melts and solidifies. Thus the number of heating steps can be reduced and the reinforcing adhesive can be readily applied in such a manner that the reinforcing adhesive does not come into contact with the joining metal in the process of melting and solidifying. In addition, the quality of electrical joining between the semiconductor package component and the substrate can be stably maintained, and a sufficient strength of the mechanical bonding between the semiconductor package component and the substrate can be ensured.

With this configuration, the first reinforcing adhesive is applied before the semiconductor package component is mounted on the substrate; the second reinforcing adhesive is applied after the semiconductor package component is mounted on the substrate; and, in the heating step, the first and second reinforcing adhesives are cured after the joining metal melts and solidifies. Accordingly, the number of heating steps can be reduced and, even when the application quantity of the first reinforcing adhesive is reduced in order to prevent degradation of the joining quality due to some of the first reinforcing adhesive mixed during the melting of the joining metal, the cured second reinforcing adhesive ensures a sufficient mechanical strength.

BRIEF DESCRIPTION OF THE DRAWINGS

FIG. 9 is a perspective view illustrating first and second reinforcing adhesives applied according to the fourth embodiment;

FIG. 18 is a process diagram illustrating another conventional mounting method;

DESCRIPTION OF EMBODIMENTS

A semiconductor package component mounting method of the present invention will be described below with respect to specific embodiments.

First Embodiment

Figure 1:
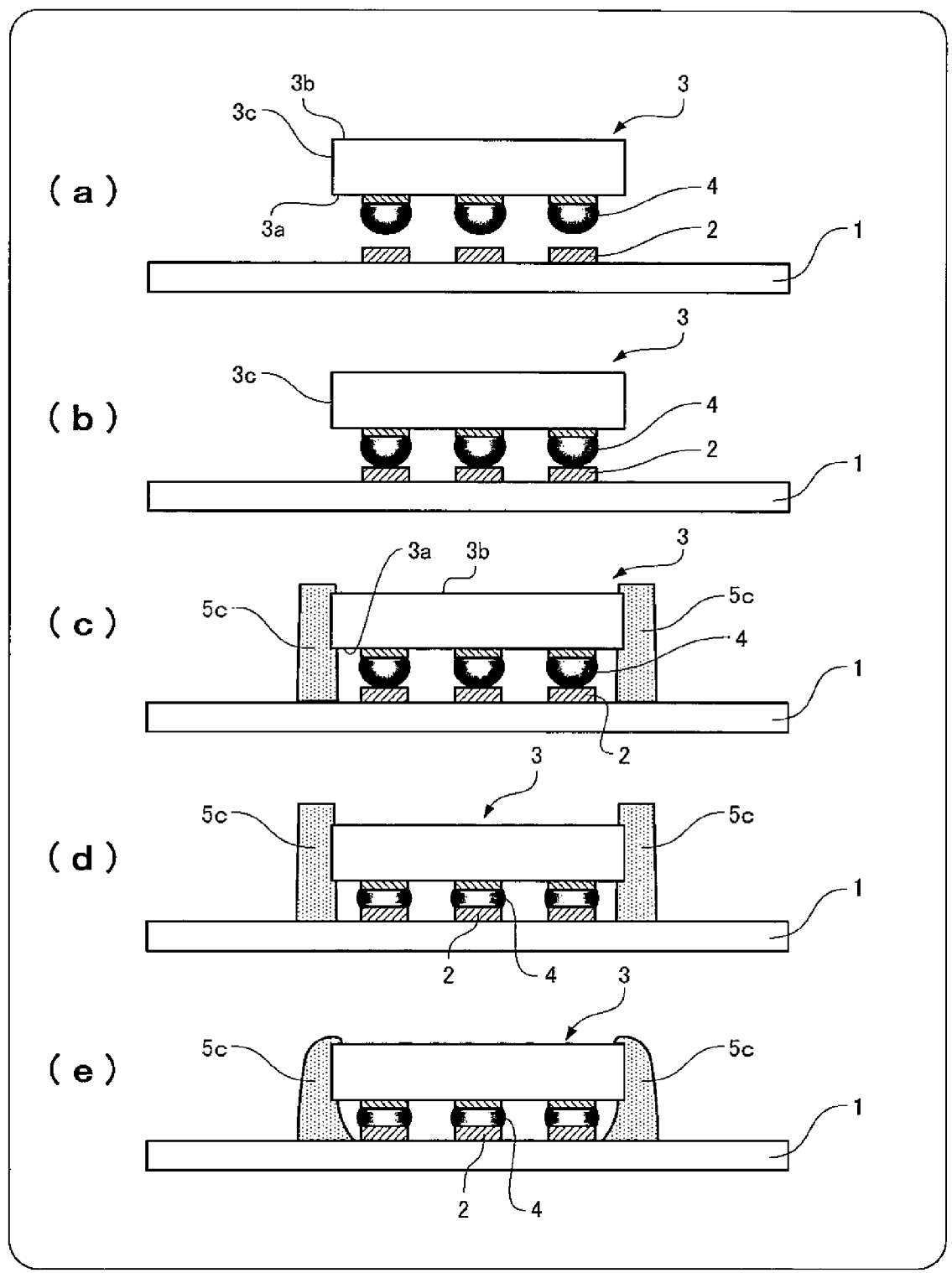
FIG. 1 is a process diagram illustrating a mounting method according to a first embodiment of the present invention.
Figure 2:
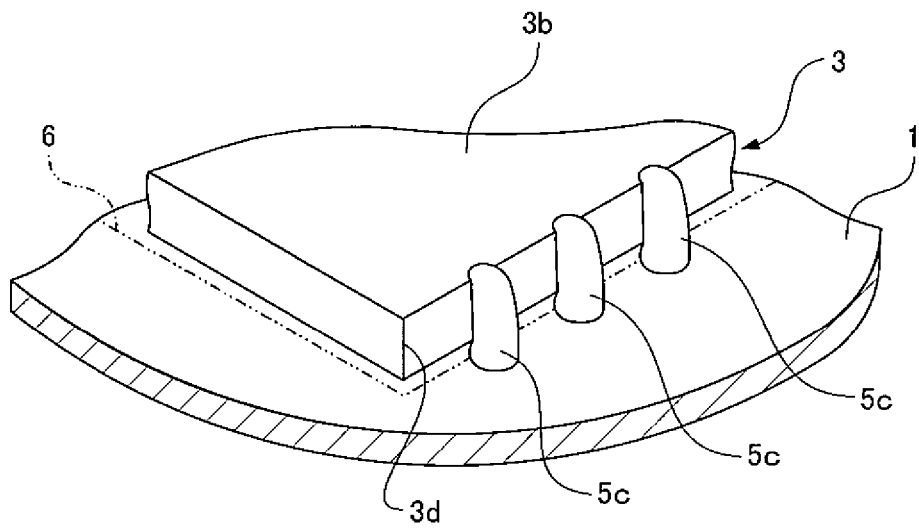
FIG. 2 is a perspective view illustrating a reinforcing adhesive applied according to the first embodiment.
Figure 3:
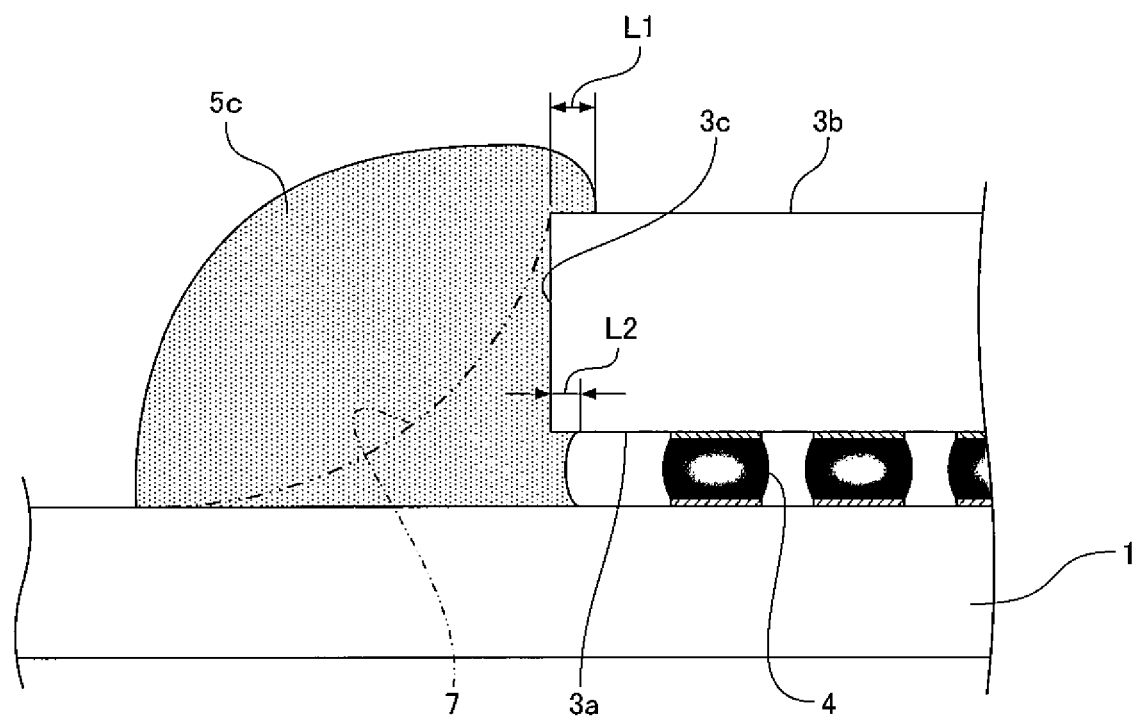
FIG. 3 is a cross-sectional view illustrating completion of mounting according to the first embodiment.

FIGS. 1 to 3 illustrate a first embodiment of the present invention.

In FIGS. 1(a) and 1(b), a BGA semiconductor package component 3 is mounted on a substrate 1 in such a manner that bump electrodes 4 of the semiconductor package component 3 come into contact with electrodes 2 on the substrate 1.

In FIG. 1(c), reinforcing adhesives 5c are applied in the form of a stick from the periphery of an area on the substrate 1 where the semiconductor package component 3 is mounted over to the outer surface of the semiconductor package component 3 at regular intervals except the corner portions as illustrated in FIG. 2. This arrangement can reduce the application quantity of the adhesive and prevent the adhesive from unnecessarily entering between the semiconductor package component 3 and the substrate. Since the reinforcing adhesives 5c are applied in the form of a stick at regular intervals except the corner portions, the semiconductor package component 3 can be fixed in a balanced manner. The reinforcing adhesive 5c herein is a thermoset resin. The reinforcing adhesive 5c is applied in such a manner that the reinforcing adhesive 5c does not contact the bump electrodes 4.

In FIG. 1(d), reflow is performed. In the reflow, the solder of the bump electrodes 4 melts. Since the reinforcing adhesive 5c is not cured at this point, the semiconductor package component 3 is moved to a proper position by the self-alignment effect of the melted solder between the electrodes on the substrate 1 and the electrodes of the semiconductor package component 3.

In FIG. 1(e), the temperature further rises to cure the reinforcing adhesive 5c. Then the temperature is decreased to the melting temperature of the solder or lower to solidify the solder, thereby completing the electrical connection and mechanical bonding of the semiconductor package component 3 and the substrate 1.

In the completed mounting structure of FIG. 3, the reinforcing adhesive 5c can be readily prevented from contacting the bump electrodes 4 even if the application quantities and application positions are varied. This is because the semiconductor package component 3 is mounted on the substrate 1 as illustrated in FIG. 1(b) and then the reinforcing adhesive 5c is applied so that the reinforcing adhesive 5c extends from a surface 3b of the semiconductor package component 3 opposite a surface 3a facing the substrate 1 to the substrate 1 as illustrated in FIG. 1(c). As illustrated in FIG. 3, in the completed mounting structure, the reinforcing adhesive 5c is away from the solder which is a joining metal. Thus, good soldering quality is achieved. A portion L1 is convex-shaped. While a portion L2 is concave-shaped, the portion L2 may be convex-shaped.

The shape of the cured reinforcing adhesive 5c is made such that $L1 \geq L2$, where L1 is a distance over which the reinforcing adhesive 5c extends onto the surface 3b of the semiconductor package component 3 opposite the surface 3a facing the substrate 1 from an end face 3c connecting the surface 3a and the surface 3b, and L2 is a distance over which the reinforcing adhesive 5c extends onto the surface 3a facing the substrate 1 from the end face 3c of the semiconductor package component 3. As a result, a great degree of reinforcement is achieved compared with a structure in which the reinforcing adhesive 5c is applied from the end face 3c of the semiconductor package component 3 to the substrate 1 as indicated by a phantom line 7 in FIG. 3 in the step of FIG. 1(c) and then cured by reflow.

Figure 10:
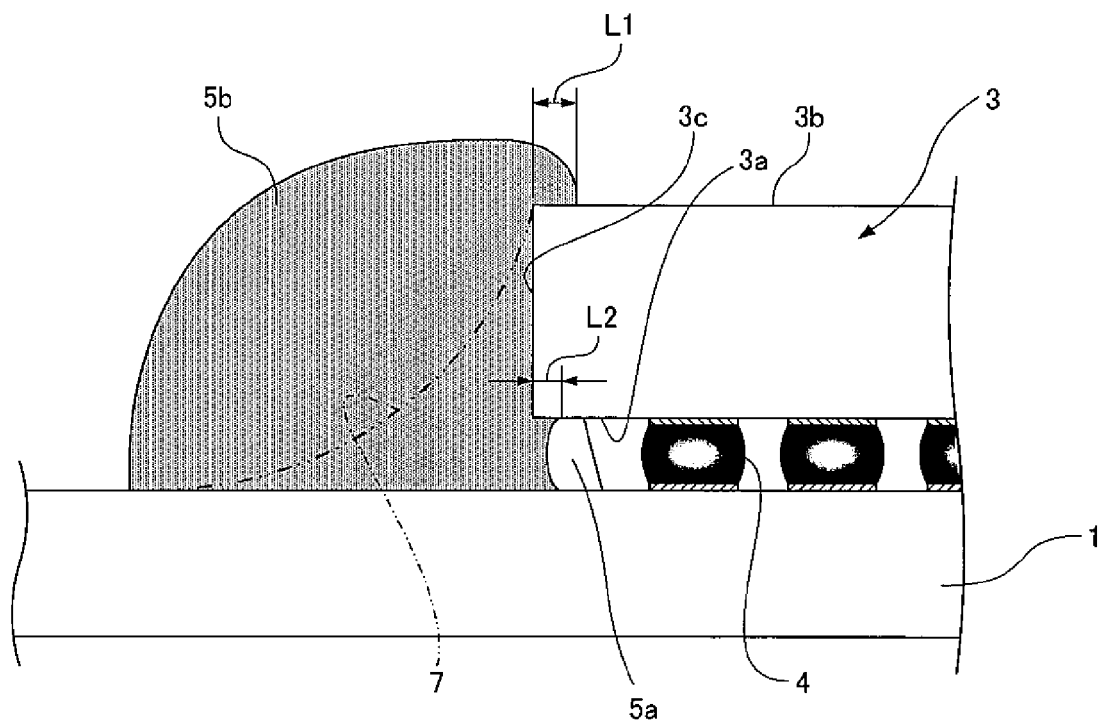
FIG. 10 is a cross-sectional view illustrating completion of mounting according to the fourth embodiment.
Figure 11:
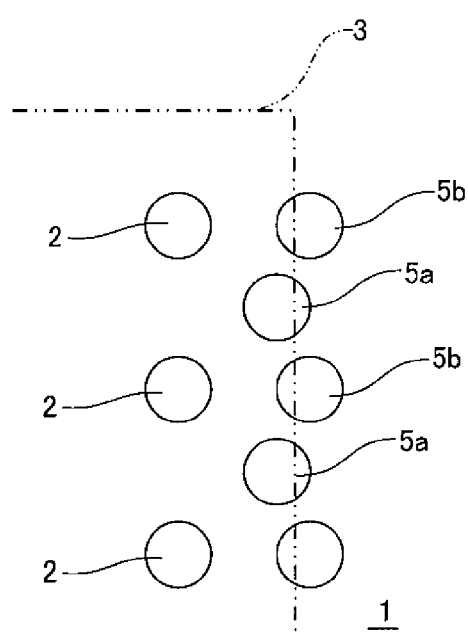
FIG. 11 is a horizontal cross-sectional view illustrating the first and second reinforcing adhesives applied according to the fourth embodiment.

It should be noted that even when the reinforcing adhesive 5c is cured in the shape indicated by the phantom line 7 in FIG. 3, better soldering quality and a greater degree of reinforcement are achieved than in the conventional example illustrated in FIGS. 9 to 11.

A gap between the substrate 1 and the semiconductor package component 3 in this case is approximately 0.2 mm. The melting point and solidification start temperature of the solder of the bump electrodes 4 were in the range of 217° C. to 219° C. and 219° C., respectively. The viscosity of the reinforcing adhesive 5c was 60 Pa·s (measured with a cone and plate viscometer at 5 rpm and 25° C.) The curing start temperature of the reinforcing adhesive 5c was 185° C. and the curing peak temperature of the reinforcing adhesive 5c was 210° C.

The thixotropy of the reinforcing adhesive 5c determined from a ratio between viscosities measured with the cone and plate viscometer at 0.5 rpm and 5 rpm at 25° C. (viscosity at 0.5 rpm/viscosity at 5 rpm) was in the range of approximately 4 to 6.

Second Embodiment

Figure 4:
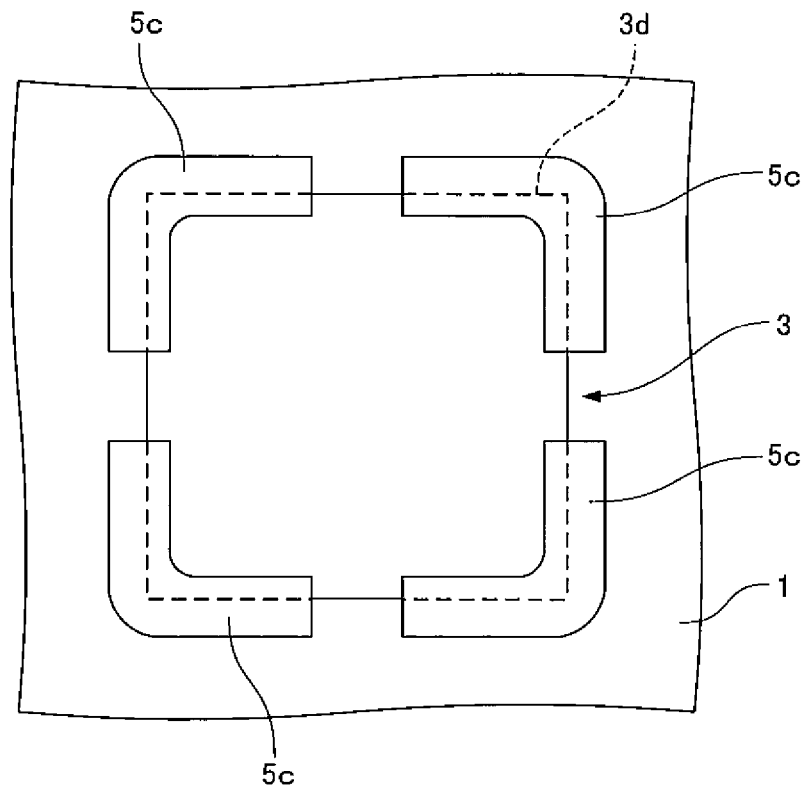
FIG. 4 is a plan view of a mounting method according to a second embodiment of the present invention.
Figure 5:
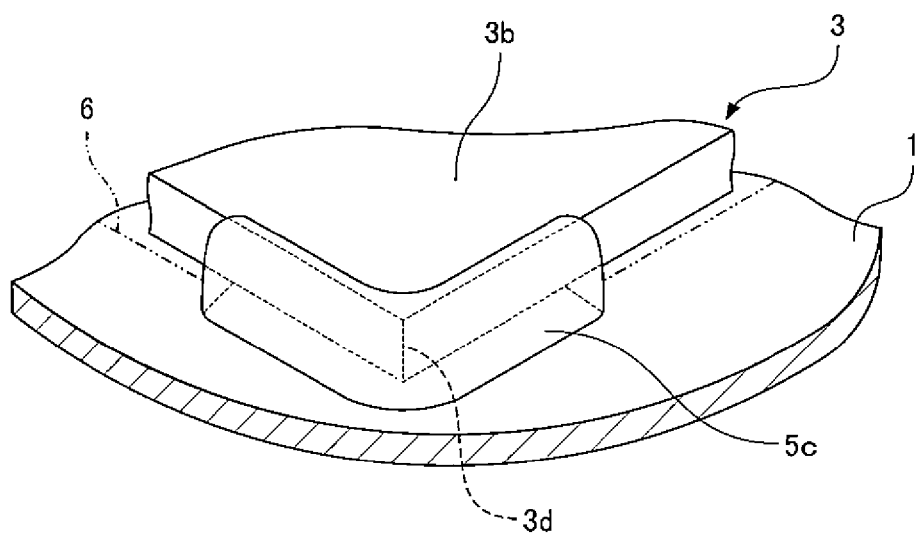
FIG. 5 is a perspective view illustrating completion of mounting according to the second embodiment.

FIGS. 4 and 5 illustrate a second embodiment.

In the first embodiment, the reinforcing adhesive 5c is applied to a portion except the corner portions 3d of the semiconductor package component 3 and cured. In the second embodiment, in the step of FIG. 1(c), a reinforcing adhesive 5c is applied to portions of a semiconductor package component 3 including corner portions 3d, and distances L1 and L2 of the cured reinforcing adhesive 5c are set such that $L1 \geq L2$. The second embodiment is different from the first embodiment only in the shape of the applied reinforcing adhesive 5c. Others are the same as in the embodiment.

In the second embodiment, better soldering quality and a greater degree of reinforcement than in the first embodiment are achieved.

Third Embodiment

Figure 6:
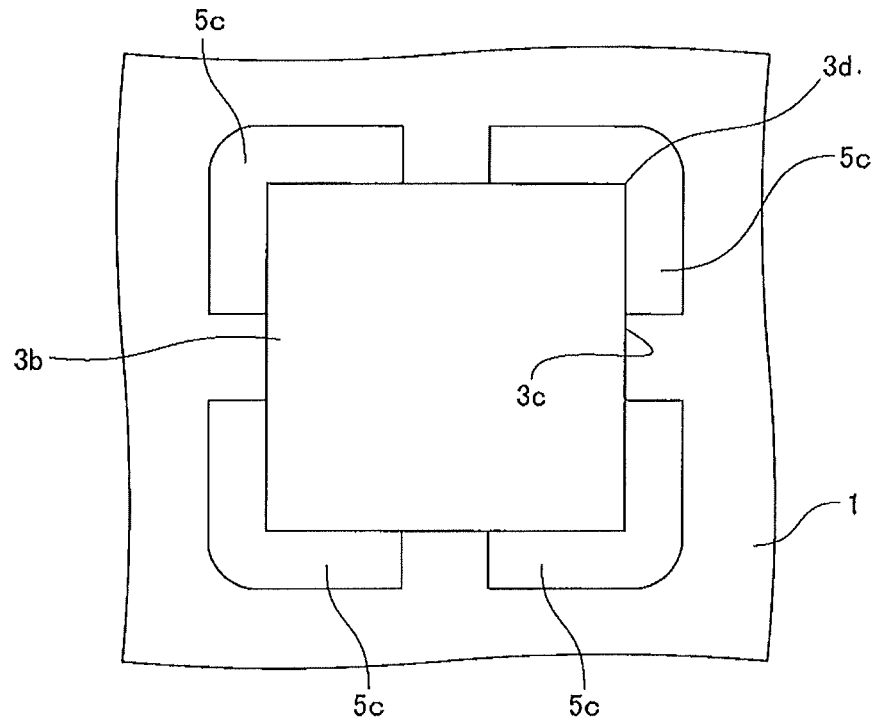
FIG. 6 is a plan view of a mounting method according to a third embodiment of the present invention.
Figure 7:
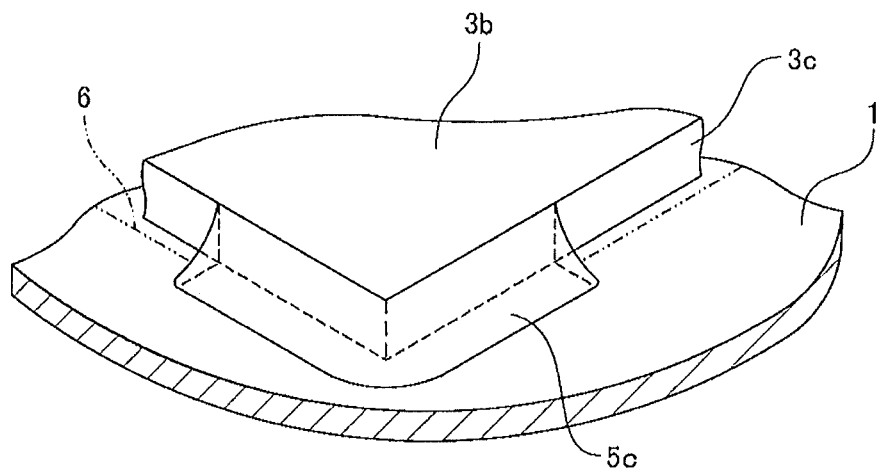
FIG. 7 is a perspective view illustrating completion of mounting according to the third embodiment.

FIGS. 6 and 7 illustrate a third embodiment.

In the second embodiment, the reinforcing adhesive 5c is applied to the portions of the semiconductor package component 3 including the corner portions 3d of the semiconductor package component 3 in such a manner that $L1 \geq L2$. The third embodiment differs from the second embodiment in that L1=0. Specifically, the third embodiment differs from the first embodiment only in that a reinforcing adhesive 5c is applied in such a manner that the reinforcing adhesive 5c extends from an end face 3c that connecting a surface 3a of a semiconductor package component 3 facing a substrate 1 and an opposite surface 3b to the substrate 1. Others are the same as in the first embodiment.

Figure 21:
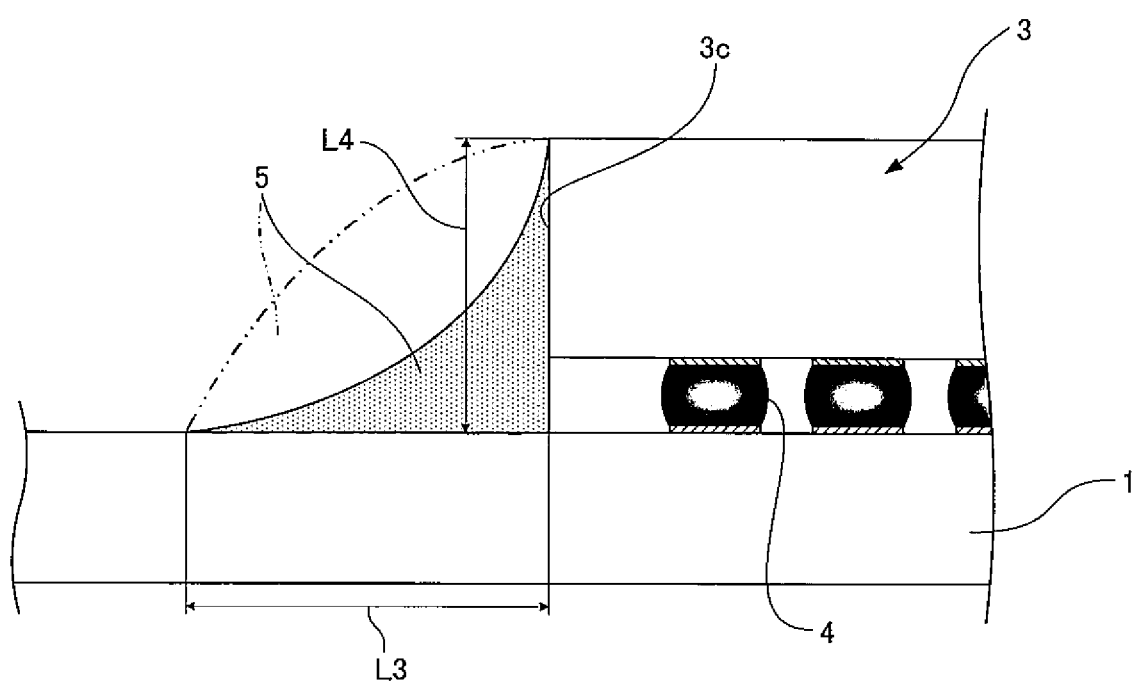
FIG. 21 is a cross-sectional view of a variation of the third embodiment.

The reinforcing adhesive 5c is applied from the end face 3c of the semiconductor package component 3 to cover the full height of the end face 3c of the semiconductor package component 3 in a position where the reinforcing adhesive 5c is applied and the surface of the reinforcing adhesive 5c outside from the end face 3c of the semiconductor package component 3 is concave-shaped along the height of the end face 3c as illustrated in FIG. 21. A distance L3 from the edge of the semiconductor package component 3 to the perimeter of the reinforcing adhesive 5c is preferably greater than a distance L4 from the substrate 1 to the top of the semiconductor package component 3.

While the shape of the surface of the reinforcing adhesive 5c outside from the end face 3c is concave-shaped along the height of the end face 3c in FIGS. 7 and 21, the completed shape of the surface of the reinforcing adhesive 5c may be convex-shaped as indicated by a phantom line in FIG. 21, depending on the viscosity of the used reinforcing adhesive 5c.

According to the embodiment, better soldering quality and a greater degree of reinforcement than in the conventional art are achieved.

While the embodiments have been described with respect to BGA semiconductor package components 3 by way of example, the embodiments are also applicable to LGA (Land Grid Array) semiconductor package components 3. In the case of the LGA semiconductor package component 3, a paste containing a joining metal is applied to at least one of a set of electrodes of the semiconductor package component 3 and a set of electrodes 2 of a substrate 1 to be joined to the set of the electrodes of the semiconductor package component 3. Then the semiconductor package component 3 can be mounted on the substrate 1 to implement the present invention.

Fourth Embodiment

FIGS. 8 to 11 illustrate a fourth embodiment of the present invention.

In FIGS. 8(a) and 8(b), a first thermoset resin 5a is applied in the form of a dot in a position 6 on a substrate 1 where a semiconductor package component 3 is to be mounted. FIG. 9 illustrates how the first thermoset resin 5a is applied.

In FIG. 8(c), the semiconductor package component 3 is mounted on the substrate 1 in such a manner that bump electrodes 4 of the semiconductor package component 3 come into contact with electrodes 2 on the substrate 1. At this point, the uncured first thermoset resin 5a is disposed between and in contact with the substrate 1 and the underside of the semiconductor package component 3.

Figure 8:
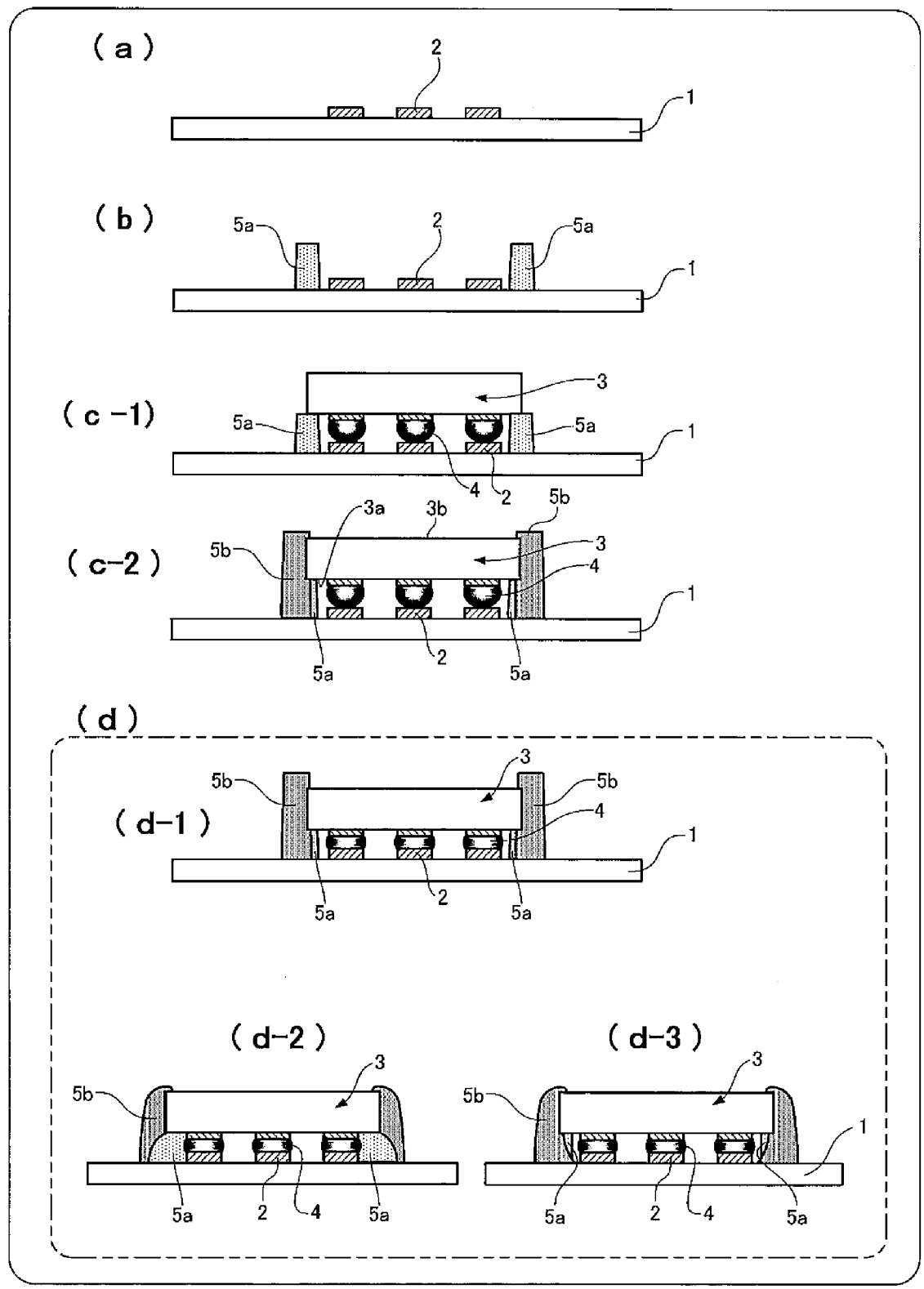
FIG. 8 is a process diagram of a mounting method according to a fourth embodiment of the present invention.

In FIG. 8(c-1), the semiconductor package component 3 is mounted on the substrate 1 in such a manner that the bump electrodes 4 of the BGA semiconductor package component 3 come into contact with the electrodes 2 on the substrate 1.

In FIG. 8(c-2), a second reinforcing adhesive 5b is applied between the periphery of the area on the substrate 1 where the semiconductor package component 3 is mounted and the outer surface of the semiconductor package component 3, for example, at predetermined intervals, as illustrated in FIG. 9(b). Here, the second reinforcing adhesive 5b is a thermoset resin.

In FIG. 8(d), reflow is performed.

FIG. 8(d) includes FIGS. 8(d-1), 8(d-2) and 8(d-3). FIGS. 8(d-2) and 8(d-3) depict cross sections as viewed from different angles at the same point in time in the reflow to show how the first and second reinforcing adhesives 5a and 5b have changed from the state in FIG. 8(d-1).

In FIG. 8(d-1), the solder of the bump electrodes 4 is melted by the reflow. Since the first and second reinforcing adhesives 5a and 5b are uncured at this point in time, the semiconductor package component 3 moves to a proper position by the self-alignment effect of the melted solder between the electrodes 2 of the substrate 1 and the electrodes of the semiconductor package component 3.

After the temperature further rises and the first and second reinforcing adhesives 5a and 5b are cured as illustrated in FIGS. 8(d-2) and 8(d-3), the temperature is decreased to the melting point of the solder or lower to solidify the solder, thereby completing the electrical connection and mechanical bonding of the semiconductor package component 3 and the substrate 1. FIG. 10 is a vertical cross-sectional view illustrating the completion of the mounting. FIG. 11 is a cross-sectional view taken horizontally along a plane of the electrodes 2 of the substrate 1.

In the mounting structure completed as illustrated in FIG. 10, since the semiconductor package component 3 is mounted on the substrate 1 and then the second reinforcing adhesive 5b is applied from a surface 3b opposite a surface 3a of the semiconductor package component 3 facing the substrate 1 to the substrate 1 as illustrated in FIG. 8(c-2), strong joining between the substrate 1 and the semiconductor package component 3 can be provided by the cured second reinforcing adhesive 5b even when the quantity of the first reinforcing adhesive 5a is reduced to prevent the first reinforcing adhesive 5a from contacting the solder, and strong joining may not be provided by the first reinforcing adhesive 5a between the substrate 1 and the package component 3. In addition, since the second reinforcing adhesive 5b is applied after the semiconductor package component 3 is mounted on the substrate 1, the second reinforcing adhesive 5b is distanced from the solder which is a joining metal, irrespective of variations of the application quantity and application positions, as illustrated in FIG. 10. Thus, good soldering quality is achieved.

The shape of the cured second reinforcing adhesive 5b is made such that L1>L2, where L1 is a distance over which the second reinforcing adhesive 5b extends onto the surface 3b of the semiconductor package component 3 opposite the surface 3a facing the substrate 1 from an end face 3c connecting the surface 3a and the surface 3b, and L2 is a distance over which the second reinforcing adhesive 5b extends onto the surface 3a facing the substrate 1 from the end face 3c of the semiconductor package component 3. As a result, a greater degree of reinforcement is achieved compared with a structure in which the second reinforcing adhesive 5b is applied from the end face 3c of the semiconductor package component 3 to the substrate 1 as indicated by a phantom line 7 in FIG. 10 in the step of FIG. 8(c) and then cured by reflow.

Figure 19:
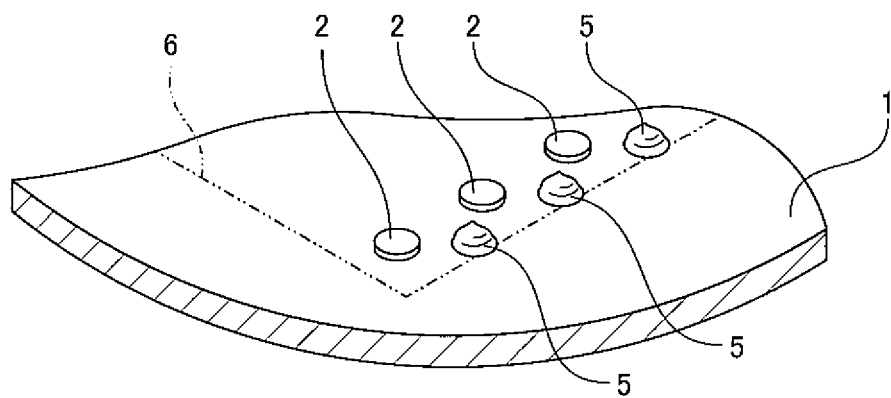
FIG. 19 is a perspective view illustrating the method in FIG. 18(b)
Figure 20:
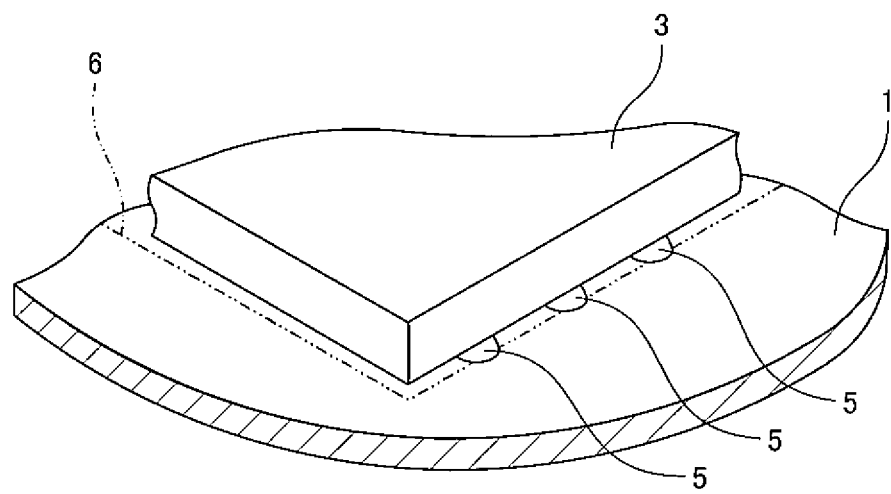
FIG. 20 is a perspective view illustrating the method in FIG. 18(c)

It should be noted that even when the second reinforcing adhesive 5b is cured in the shape represented by the phantom line 7 in FIG. 10, better soldering quality and a greater degree of reinforcement are achieved than in the conventional example illustrated in FIGS. 18 to 20.

A gap between the substrate 1 and the semiconductor package component 3 at that point was approximately 0.2 mm. The melting point and solidification start temperature of the solder of the bump electrodes 4 were in the range of 217° C. to 219° C. and 219° C., respectively. The viscosity of the reinforcing adhesive 5a was 60 Pa·s (measured with a cone and plate viscometer at 5 rpm and 25° C.). The curing start temperature of the reinforcing adhesive 5a was 185° C. and the curing peak temperature of the reinforcing adhesive 5a was 210° C.

Fifth Embodiment

Figure 12:
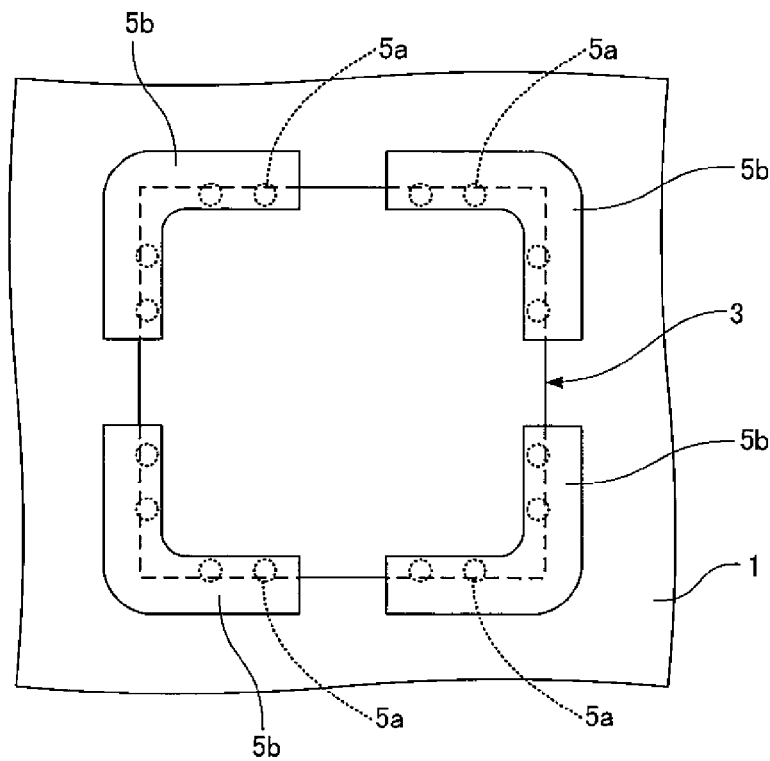
FIG. 12 is a plan view illustrating completion of mounting of a mounting method according to a fifth embodiment of the present invention.
Figure 13:
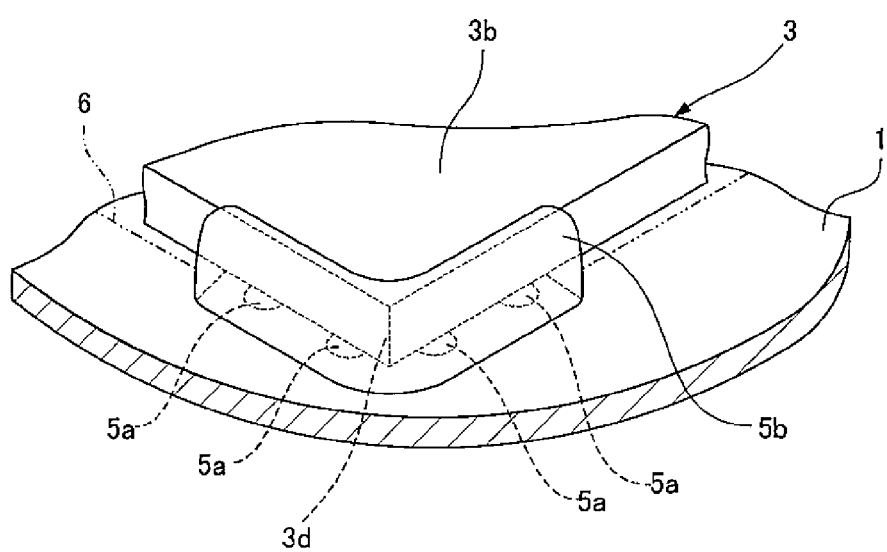
FIG. 13 is a perspective view illustrating the completion of mounting according to the fifth embodiment.
Figure 14:
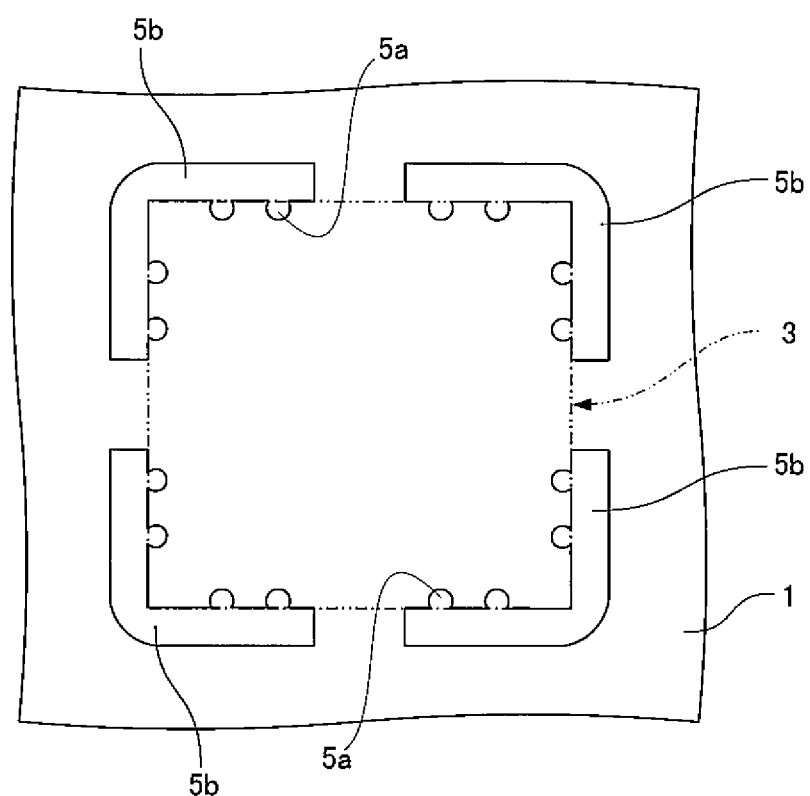
FIG. 14 is a horizontal cross-sectional view illustrating the completion of mounting according to the fifth embodiment.

FIGS. 12 to 14 illustrate a fifth embodiment.

In the fourth embodiment, the second reinforcing adhesive 5b is applied to portions of the semiconductor package component 3 except the corner portions 3d. In the fifth embodiment, a second reinforcing adhesive 5b is applied to portions of a semiconductor package component 3 including corner portions 3d of the semiconductor package component 3 in the step of FIG. 8(c-2). Distances L1 and L2 of the cured second reinforcing adhesive 5b are set such that L1≥L2. The fifth embodiment is different from the fourth embodiment only in the shape of the applied second reinforcing adhesive 5b. Others are the same as in the fourth embodiment.

According to the fifth embodiment, good soldering quality and a greater degree of reinforcement than in the fourth embodiment are achieved as illustrated in FIG. 13. FIG. 14 is a horizontal cross-sectional view of a first reinforcing adhesive 5*a* and the second reinforcing adhesive 5*b* which are cured.

Sixth Embodiment

Figure 15:
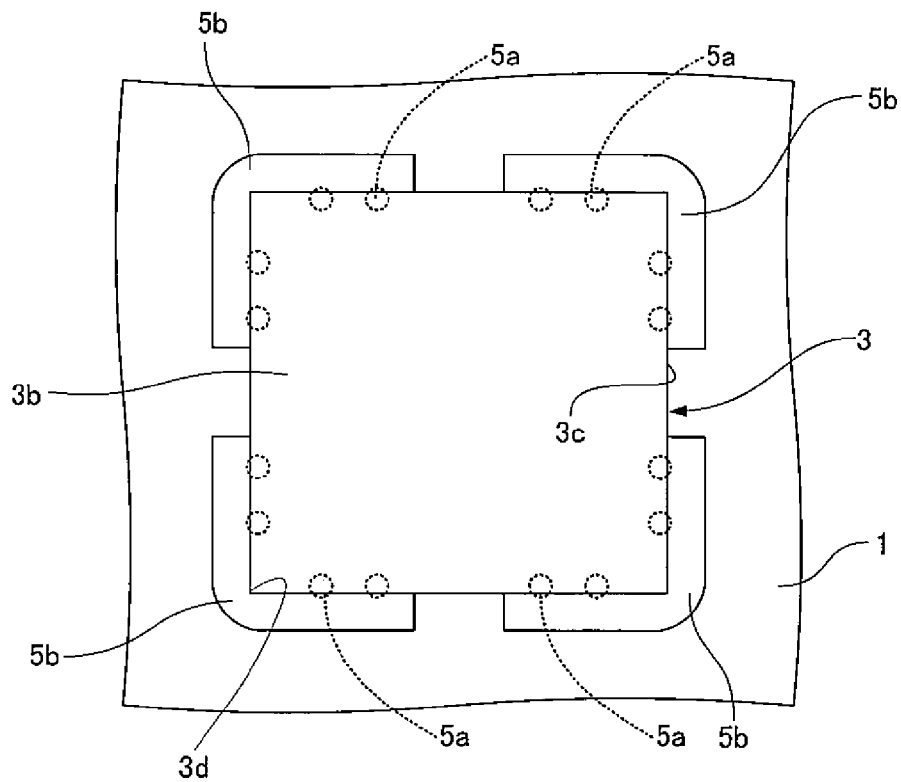
FIG. 15 is a plan view illustrating completion of mounting of a mounting method according to a sixth embodiment of the present invention.
Figure 16:
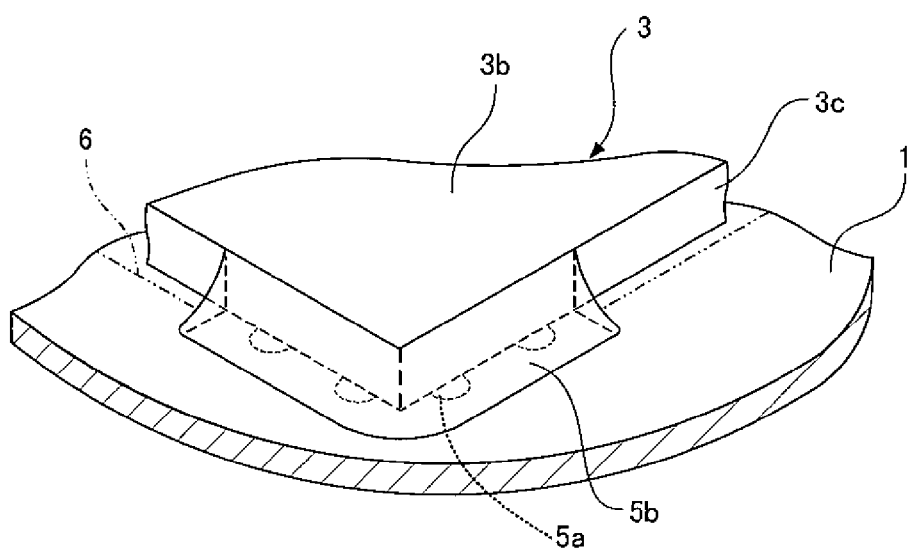
FIG. 16 is a perspective view illustrating the completion of mounting according to the sixth embodiment.
Figure 17:
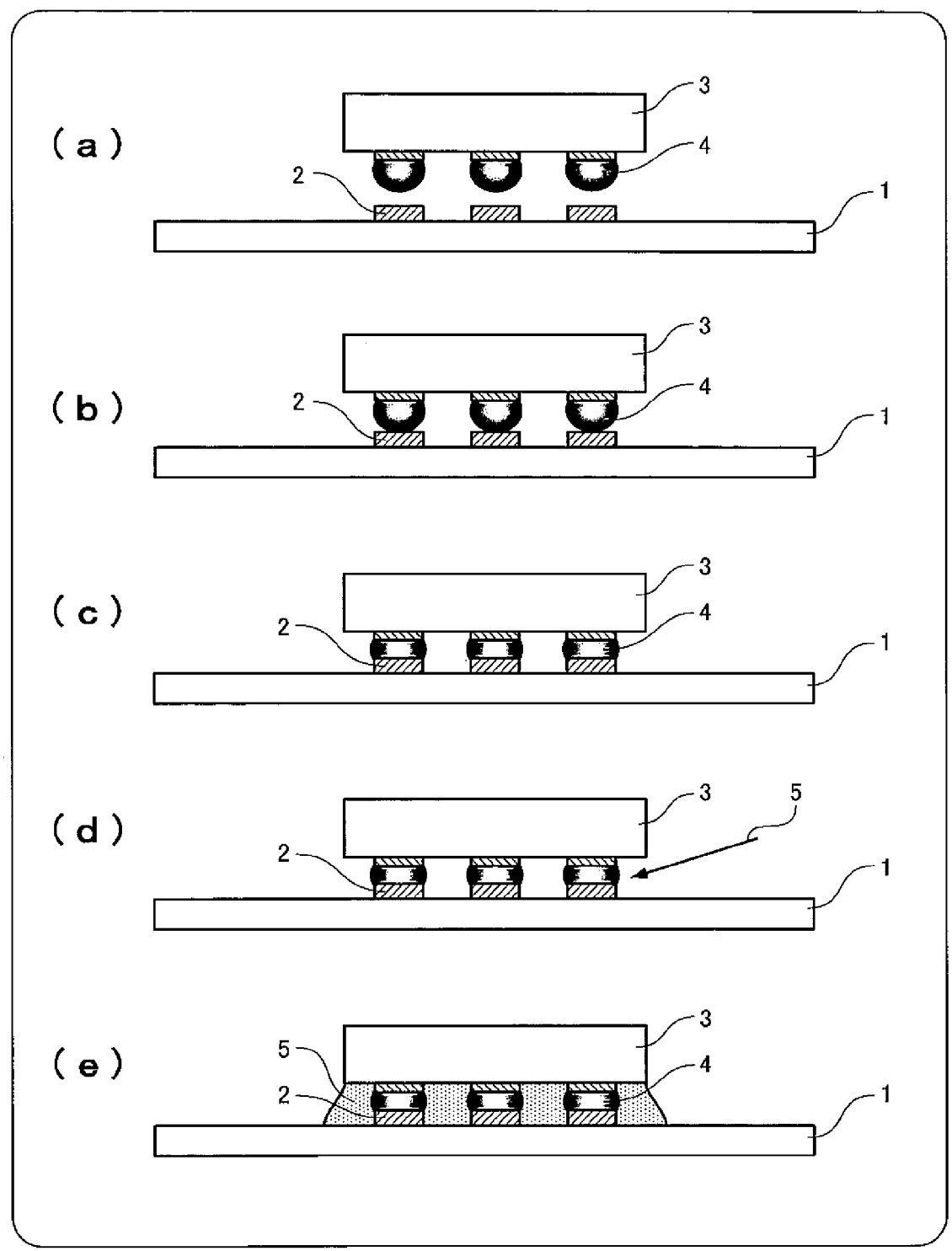
FIG. 17 is a process diagram illustrating a conventional mounting method.

FIGS. 15 and 16 illustrate a sixth embodiment.

In the fifth embodiment, the second reinforcing adhesive 5*b* is applied to the portions of the semiconductor package component 3 including the corner portions 3*d* of the semiconductor package component 3 in such a manner that L1≥L2. The sixth embodiment differs from the fifth embodiment in that L1=0. Specifically, the sixth embodiment is different from the fourth embodiment only in that a second reinforcing adhesive 5*b* is applied in such a manner that the second reinforcing adhesive 5*b* extends from an end face 3*c* connecting a surface 3*a* of a semiconductor package component 3 facing a substrate 1 and an opposite surface 3*b* to the substrate 1. Others are the same as in the fourth embodiment.

According to the embodiment, good soldering quality and a greater degree of reinforcement than in the fourth embodiment are achieved.

While the embodiments have been described with respect to BGA semiconductor package components 3 by way of example, the embodiments are also applicable to LGA (Land Grid Array) semiconductor package components 3. In the case of the LGA semiconductor package component 3, a paste containing a joining metal is applied to at least one of a set of electrodes of the semiconductor package component 3 and a set of electrodes 2 of a substrate 1 to be joined to the set of the electrodes of the semiconductor package component 3. Then the semiconductor package component 3 can be mounted on the substrate 1 to implement the present invention.

INDUSTRIAL APPLICABILITY

The present invention is useful for fabrication of various electronic devices such as mobile devices that may be subjected to drop impact.

The invention claimed is:

1. A semiconductor package component mounting method comprising:
   mounting a semiconductor package component on a substrate in such a manner that an electrode of the substrate and an electrode of the semiconductor package component are brought into contact with each other through a solidified joining metal;
   applying a reinforcing adhesive between a periphery of an area on the substrate where the semiconductor package component is mounted and an outer surface of the semiconductor package component in such a manner that the reinforcing adhesive does not contact the joining metal; and
   performing reflow by successively heating to pass a curing start temperature of the reinforcing adhesive, melting the joining metal after passing a curing peak temperature of the reinforcing adhesive, raising the temperature of the reinforcing adhesive until the reinforcing adhesive is cured with the joining metal being in a molten state when the curing of the reinforcing adhesive is completed, and lowering the temperature to solidify the joining metal.

2. The semiconductor package component mounting method according to claim 1, wherein, in the applying of the reinforcing adhesive, the reinforcing adhesive is applied so that the reinforcing adhesive extends from a surface of the semiconductor package component opposite a surface facing the substrate to the substrate.

3. The semiconductor package component mounting method according to claim 1, wherein, in the applying of the reinforcing adhesive, the reinforcing adhesive is applied so that the reinforcing adhesive extends from an end face of the semiconductor package component to the substrate, the end face connecting a surface of the semiconductor package component facing the substrate and a surface opposite the surface.

* * * * *